United States Patent
Tsironis

(10) Patent No.: US 10,103,713 B1
(45) Date of Patent: Oct. 16, 2018

(54) HYBRID ELECTRO-MECHANICAL TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 15/795,354

(22) Filed: Oct. 27, 2017

Related U.S. Application Data

(60) Provisional application No. 62/413,636, filed on Oct. 27, 2016.

(51) Int. Cl.
 *H03H 11/30* (2006.01)
 *H01P 1/383* (2006.01)
 *G01R 31/02* (2006.01)

(52) U.S. Cl.
 CPC ............ *H03H 11/30* (2013.01); *H01P 1/383* (2013.01); *G01R 31/027* (2013.01)

(58) Field of Classification Search
 CPC ........... H03H 11/30; H01P 1/383; H01P 1/38; G01R 31/027
 See application file for complete search history.

(56) References Cited

U.S. PATENT DOCUMENTS

| | | | |
|---|---|---|---|
| 6,674,293 B1 | 1/2004 | Tsironis | |
| 7,282,926 B1 | 10/2007 | Verspecht et al. | |
| 9,331,670 B1 | 5/2016 | Mahmoudi et al. | |
| 9,632,124 B2 * | 4/2017 | Simpson | G01R 29/26 |

OTHER PUBLICATIONS

"A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on Apr. 6, 2017]. Retrieved from Internet <URL: http://ieeexplore.ieee.org/document/1123701/>.

"Active Load Pull System, ALPS", Product Note 33, Focus Microwaves, 1966, p. 3, Figure 3.

"Computer-Aided Error Correction of Large-Signal Load-Pull Measurements", Tucker, R.S. and BR Adley P., [online], IEEE Transactions on Microwave Theory and Techniques, vol. MTT-32, No. 3, Mar. 1984, pp. 296-300. [Retrieved Apr. 6, 2017]. Retrieved from Internet < URL: http://ieeexplore.ieee.org/document/1132668/>.

(Continued)

*Primary Examiner* — Jung Kim

(57) ABSTRACT

A hybrid electro-mechanical tuner uses a modified version of the forward injection technique, also called Gamma Boosting Unit (GBU), integrated with a passive slide screw impedance tuner in the same slabline and housing. The modified GBU samples a phase-and-amplitude adjustable portion of the forward travelling signal at the fundamental frequency, amplifies it and injects it back, in reverse direction, into the main signal path through a circulator connected at the idle port of the tuner, after the mechanical tuning probe. The horizontal and vertical control of the forward coupler (wave-probe) of the modified GBU which is attached to the vertical axis in a mobile carriage, is manual or remote and eliminates the need for a dedicated phase shifter and attenuator, making the solution better, simpler and more effective.

3 Claims, 9 Drawing Sheets

(56) References Cited

OTHER PUBLICATIONS

"Comparison of Active Versus Passive On-wafer Load-pull Characterization of Microwave and Millimeter-wave Power Devices," J. E. Muller and B. Gyselinckx, [online],1994 IEEE MTT-S Digest, CH3389-4/94/0000-1007$01.00, pp. 1007-1080, Figure 1, [Retrieved Apr. 6, 2017]. Retrieved from Internet <URL: http://ieeexplore.ieee.org/iel5/1100/7886/00335168.pdf>.
"MPT, a Universal Multi-Purpose Tuner, Product Note 79", Focus Microwaves Inc., Oct. 2004.
"Multi Port Measurements", presentation by, D Blackham and K. Wong, Agilent Technologies. pp. 3-8.

* cited by examiner

FIG. 5: Prior art (see FIG. 4)

HYBRID ELECTRO-MECHANICAL TUNER

PRIORITY CLAIM

This application claims priority on provisional application 62/413,636, titled "Hybrid Electro-Mechanical Tuner", filed on Oct. 27, 2016.

CROSS-REFERENCE TO RELATED ARTICLES

1. "A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on Apr. 6, 2017]. Retrieved from Internet <URL: http://ieeexplore.ieee.org/document/1123701/>.
2. "Active Load Pull System, ALPS", Product Note 33, Focus Microwaves, 1966, page 3, FIG. 3.
3. "Computer-Aided Error Correction of Large-Signal Load-Pull Measurements", TUCKER, R. S. and BRADLEY P., [online], IEEE Transactions on Microwave Theory and Techniques, vol. MTT-32, No. 3, March 1984, pp. 296-300. [Retrieved Apr. 6, 2017]. Retrieved from Internet <URL: http://ieeexplore.ieee.org/document/1132668/>.
4. "Comparison of Active Versus Passive On-wafer Load-pull Characterization of Microwave and Millimeter-wave Power Devices," J. E. Muller and B. Gyselinckx, [online], 1994 IEEE MTT-S Digest, CH3389-4/94/0000-1007$01.00, pp 1007-1080, FIG. 1, [Retrieved Apr. 6, 2017]. Retrieved from Internet <URL: http://ieeexplore.ieee.org/iel5/1100/7886/00335168.pdf>.
5. Mahmoudi et al. U.S. Pat. No. 9,331,670, "Gamma Boosting Unit (GBU) for Hybrid Load and Source Pull"
6. "MPT, a Universal Multi-Purpose Tuner, Product Note 79", Focus Microwaves Inc., October 2004.
7. "Multi Port Measurements", presentation by, D. Blackham and K. Wong, Agilent Technologies. Pages 3-8.
8. Verspecht et al., U.S. Pat. No. 7,282,926 "Method and an apparatus for characterizing a high-frequency device-under-test in a large signal impedance tuning environment".
9. Tsironis C, U.S. Pat. No. 6,674,293, "Adaptable Pre-matched Tuner System and Method".

BACKGROUND OF THE INVENTION

This invention relates to high power load pull (see ref. 4) testing of microwave transistors (DUT) in the nonlinear operation regime. When driven in its nonlinear operation regime, the internal impedance at the output port of power transistors, DUT (21) is very low, of the order of 1Ω An impedance tuner (20) used to match the transistor must also physically match such impedance (FIG. 1). Passive impedance tuners (23, 20) are used to generate such impedance. The signal (25) is injected into and extracted from the DUT (21) via bidirectional couplers (11, 10) which allow the power waves travelling along the main line to be sampled (26) and measured by the receiver (VNA, 24). The output port of tuner (20) is terminated (19) with characteristic impedance Zo (50Ω). The VNA (24) and tuners (23, 20) are controlled digitally (17, 18) by a system controller (22).

Passive tuners can create maximum reflection factors $|\Gamma_{tuner}|$ of the order of 0.95, corresponding to a smallest impedance of 2.45Ω. The unavoidable insertion loss between DUT and tuner reduces even further the available tuning range at the DUT reference plane and thus the capacity of the passive tuner to match the transistor. The only remedy to this limitation is using "active" systems, i.e. test systems whereby a signal coherent (synchronous) with the signal injected and amplified by the DUT and reflected into the output port of the DUT by the passive tuner, is injected independently into the DUT and creates a partly real and partly virtual load. The DUT cannot distinguish which is which. This additional signal can be the only one injected, in which case we speak of "purely active" load pull, or it can be superimposed to signal reflected by the passive tuner, in which case we speak of "hybrid" load pull; obviously, if only a mechanical (passive) tuner is present, we speak of "passive" load pull. In both active injection cases (purely active and hybrid) the objective is reaching and conjugate matching the internal impedance of the transistor; in general terms a standard requirement is a tuning range reaching a reflection factor $|\Gamma|=1$ (corresponding to a real part of the internal impedance of 0Ω). The objective of this invention is an active tuner apparatus, combining a forward signal injection mechanism within an electro-mechanical tuner architecture allowing $|\Gamma|=1$.

DESCRIPTION OF PRIOR ART

There have been several attempts to active load pull systems, starting back in the 70'ies (see ref. 1 to 4). Such load pull techniques use the so called "virtual load" method. The virtual load method consists in injecting into the output of the DUT RF power at the same frequency as traversing the DUT from the input to the output, but with controlled phase and amplitude. Referring to FIG. 2 and knowing that the reflection factor "seen" by the DUT is equal to the ratio of returned (normally "reflected") power wave <$a_2$> to primary output power wave <$b_2$>: ($\Gamma_L$=<$a_2$>/<$b_2$>), it is understood that by controlling the phase and amplitude of <$a_2$> we can control $\Gamma_L$. There are a number of ways to do this: One is to use an "active load" technique (see ref. 2), in which case part of the outgoing power $P_{out}$ is sampled by a directional coupler, filtered, phase adjusted, amplified and re-injected into the output port of the DUT, which will "see" a complex load $\Gamma$ as described above. Another method is to use a split signal (see ref. 1) or two synchronized RF sources (see ref. 3) one to inject RF power into the input of the DUT and one into its output. Since the sources are synchronized, they can generate a coherent signal and if we adjust the relative phases between the sources and the amplitude of the second source, then the DUT will, again, see at its output port a "virtual" load F, as described earlier.

SUMMARY OF THE INVENTION

The concept used in this invention is a modified version of the forward injection technique, also called Gamma Boosting Unit (GBU), FIG. 2, see ref. 5. The prior art version of the GBU samples a portion of the reflected signal at the LP tuner at port 2 ($DC_B$), adjusts its phase using a phase shifter ($\varphi$), amplifies it using an amplifier (G), adjusts its amplitude (attenuation ($\tau$)) and couples it back ($DC_A$), in reverse direction into DUT. In this invention this concept is used differently: the new method uses an adjustable wave-probe (601 and FIG. 3) which eliminates the need of both the adjustable phase shifter ($\varphi$) and the adjustable attenuator ($\tau$) in FIG. 1; it also injects the power back after the electro-mechanical LP tuner and not before (FIG. 6); this is important, because, in the original GBU configuration the feed-back path (coupler $DC_A$) having internal impedance of 50Ω, is strongly mismatched with the DUT ($\Gamma_{out}$), which leads to higher power requirement from the amplifier. The low loss circulator (65) used in this invention for the feedback injection, allows for lower amplifier power, but would not be insertable before the LP tuner, because it would mask the tuning effect; this, FIG. 6 configuration, creates a better, simpler and more effective solution and allows integrating the active injection capability with an electro-mechanical impedance tuner in the same slabline with minimum transition loss.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 6:
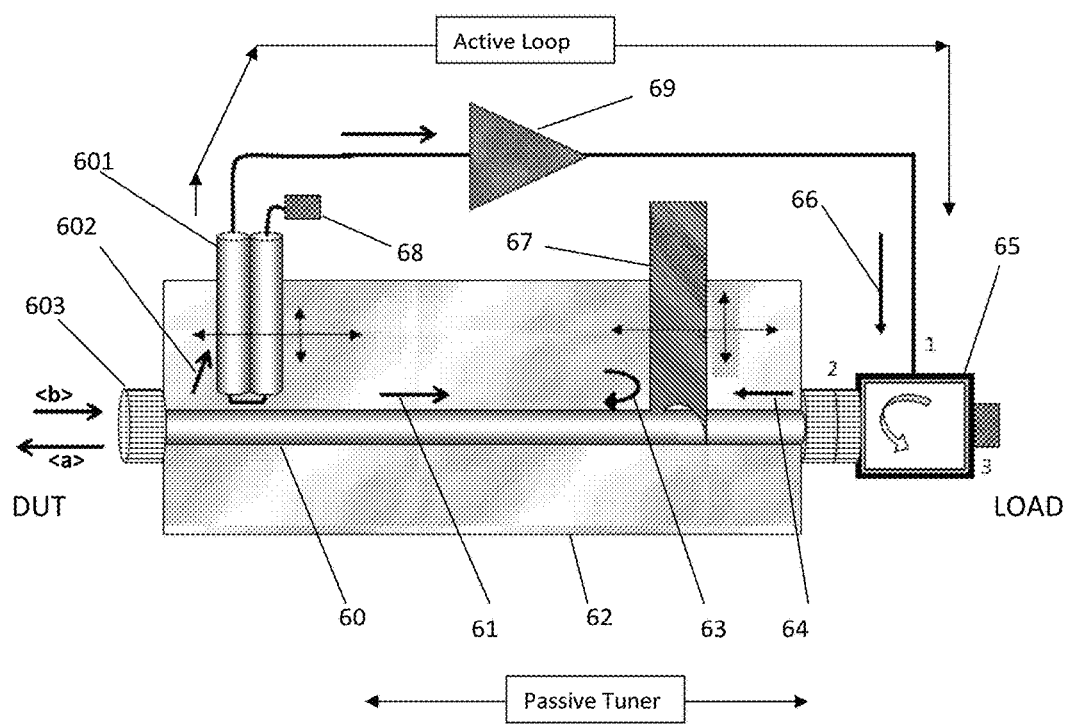
FIG. 6 depicts the hybrid electro-mechanical tuner using forward feedback and output reverse injection via circulator.

The concept of the hybrid (active/passive) slide screw tuner is shown in FIG. 6. In a single housing (62) and using the same slabline and center conductor (60) there are integrated two complementary sections: (a) the passive (slide screw) tuner section and (b) the active injection (loop) section; the passive slide screw tuner section comprises a reflective probe (67), which is mounted on the vertical axis of a mobile tuning carriage (shown in FIG. 9), as in several prior art publications (see ref. 6, 9) and creates controlled reflection factors. The active loop section comprises the integrated wave-probe (601), which is also mounted on the vertical axis of another mobile carriage (shown in FIG. 9), which can be controlled independently from the tuning carriage and probe (67). Horizontal movement of the tuning carriage controls the phase of the passive reflection factor and horizontal movement of the wave-probe carriage controls the phase of the injected feedback signal. The penetration of the reflective probe (67) controls the amplitude of the passive reflection factor and the penetration of the wave-probe (601) controls the coupling factor and this way the magnitude of the feedback injected signal. In the original GBU configuration, the feedback path (coupler $DC_A$) has internal impedance of 50Ω; therefore the injection of feedback power is strongly mismatched with the DUT ($\Gamma_{out}$) (typically 50Ω (Γ=0) versus <2Ω ($\Gamma_{out}$=0.92) internal impedance); this leads to higher power requirement from the amplifier. The low loss circulator (65) used in this invention for the feedback injection benefits in allowing for lower amplifier power, but would not be insertable before the electro-mechanical LP tuner (67), because it would mask the tuning effect (circulator impedance at all ports is 50Ω, independently on the load at the other ports).

Figure 1:
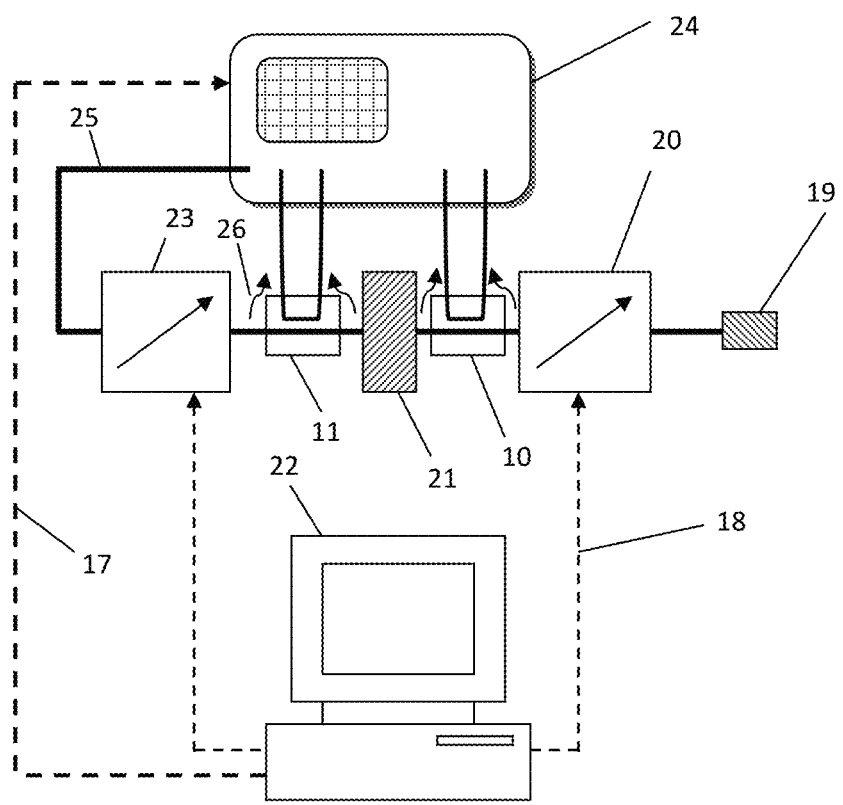
FIG. 1 depicts prior art, a load pull system using vector receiver and passive tuners.
Figure 2:
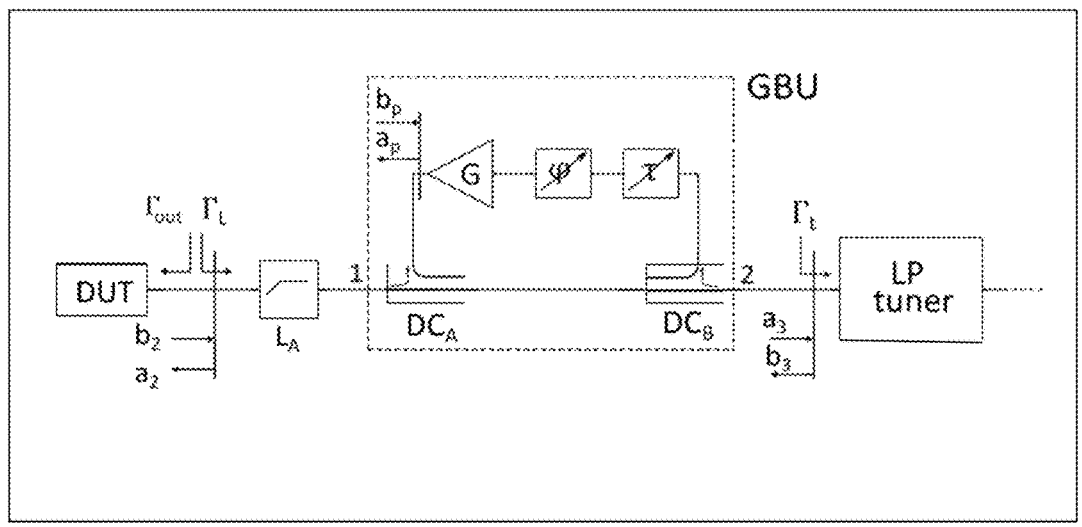
FIG. 2 depicts prior art, the Gamma Boosting Unit, a forward coupling active injection system, (see ref. 1)
Figure 3:
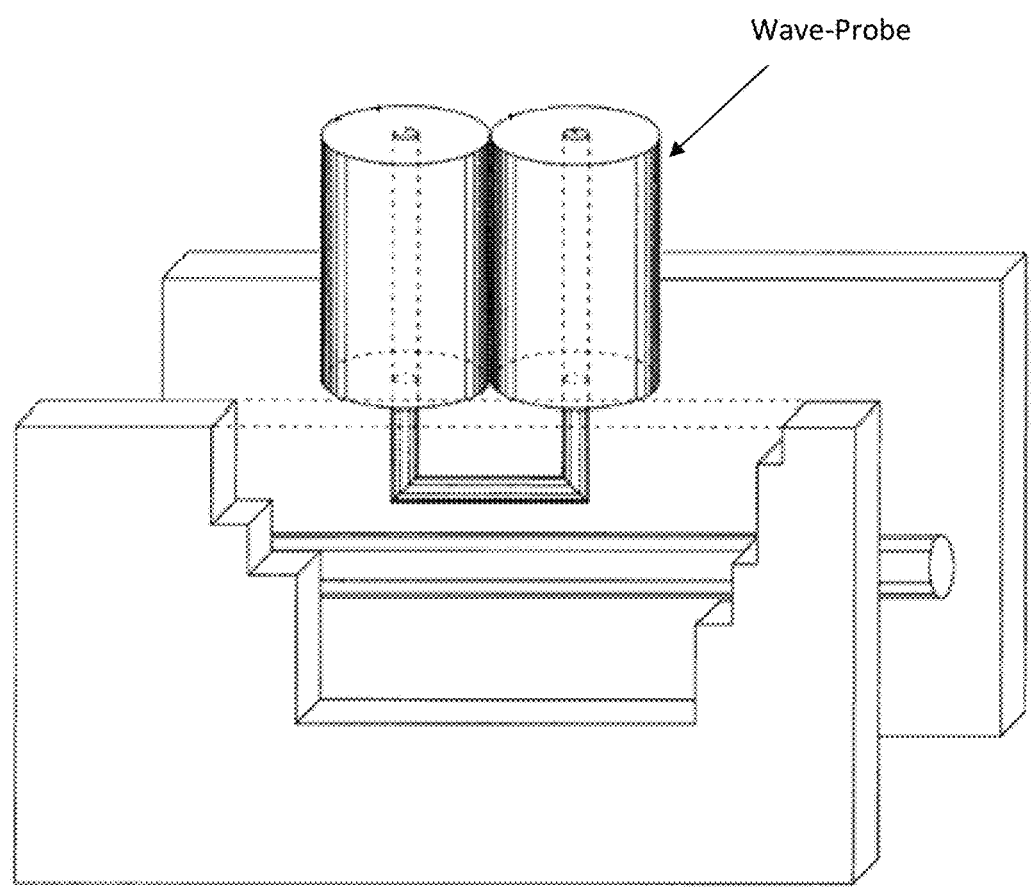
FIG. 3 depicts prior art, a compact signal coupler using a folded semi-rigid coaxial cable ("wave-probe", see ref. 8).
Figure 4:
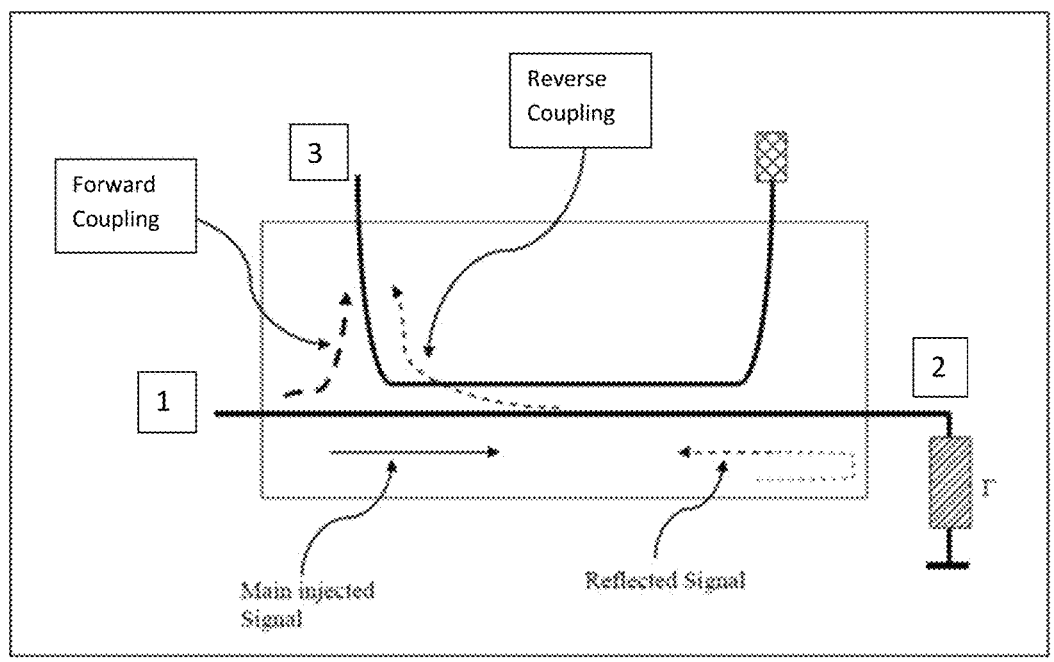
FIG. 4 depicts prior art, signal flow definitions in a directional coupler, (see ref. 3).
Figure 5:
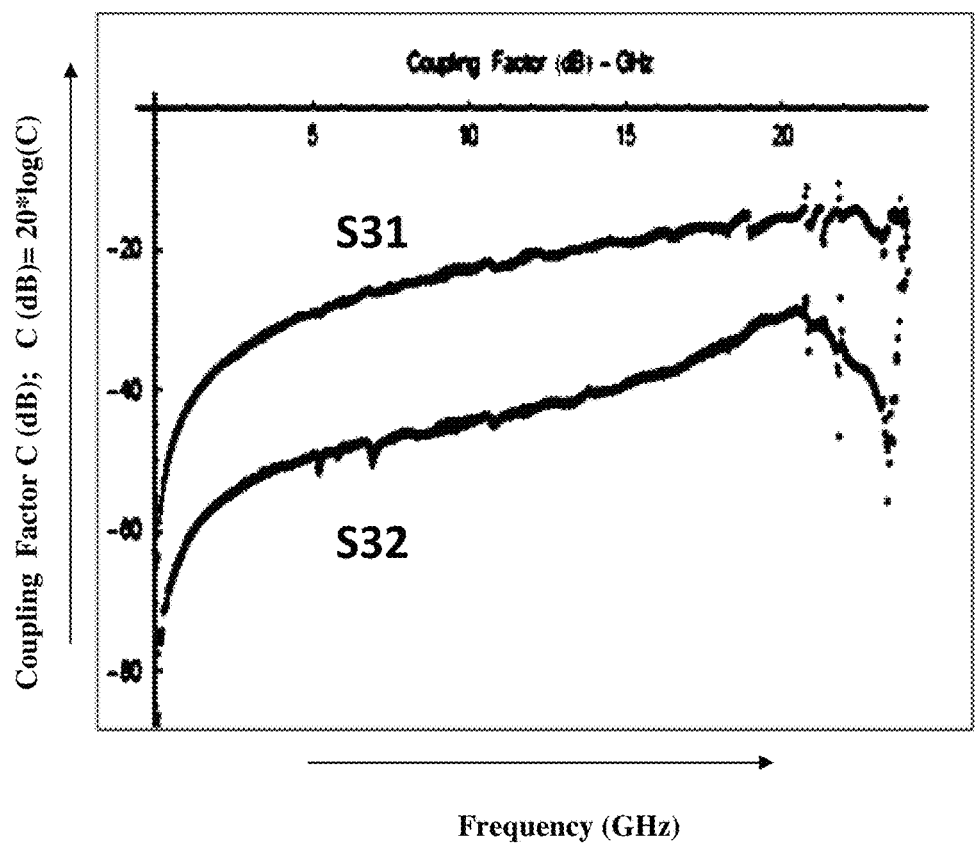
FIG. 5 depicts measurement of forward (S31) and reverse (S32) coupling of a signal coupler (wave-probe), as depicted in FIG. 3, as a function of frequency.

FIG. 5 depicts forward and reverse coupling of a wave-probe coupler (see ref. 8) as depicted in FIG. 3. The logarithmic difference in forward and reverse coupling, also called "directivity" of over 10 dB for this simple uncompensated structure, shows the utility of the application. The coupling factor itself (S31) is adjustable by setting the distance between center conductor and coupler through vertical movement of the vertical axis on which the wave-probe is mounted. This allows adjusting the attenuation of the active loop.

Figure 8:
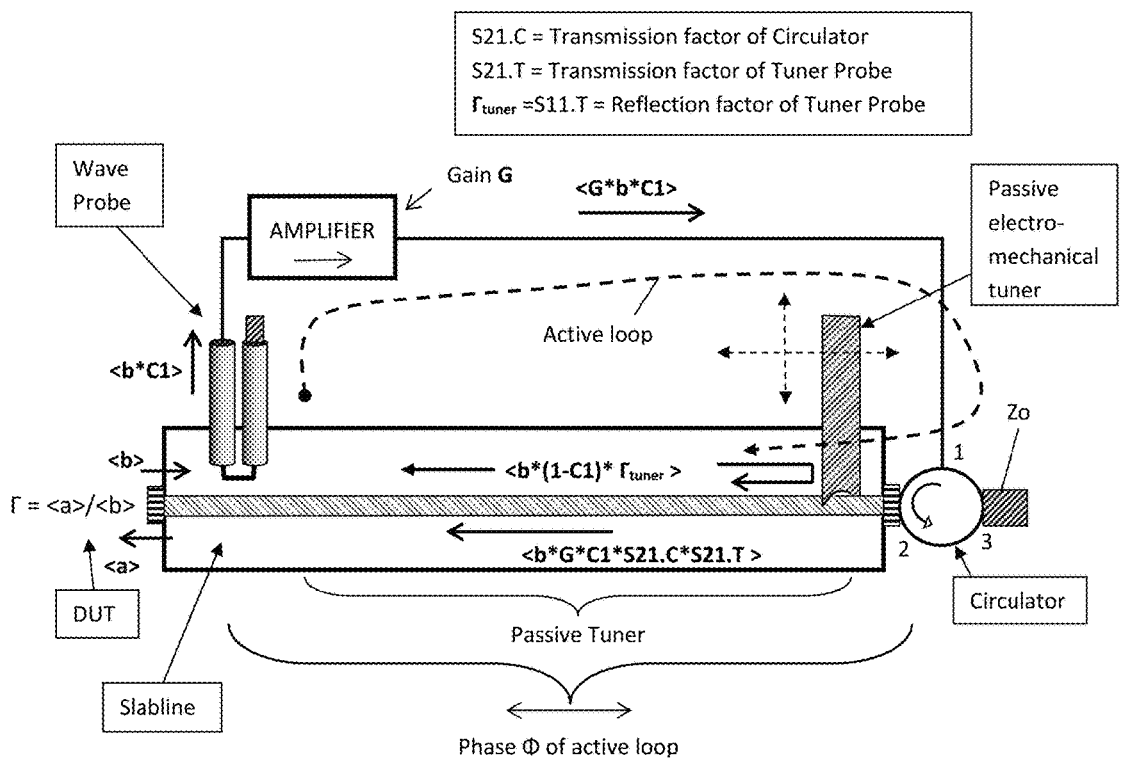
FIG. 8 depicts signal flow and relevant quantities and dependencies in the hybrid tuner.

The actual embodiment of the invention is shown in FIGS. 6 and 8: The signal <b> from the output port of the DUT entering at the test port (603) is sampled (602) by the wave-probe (601), of which the isolated port is terminated with characteristic impedance Zo (68), and the sampled signal is amplified (69) and injected (66, 64) backwards into the slabline (62) using a circulator (65) and travels through the electro-mechanical impedance tuner (67). The circulator is terminated at its port 3 by the characteristic impedance (or the matched detector head of a power meter). The signal entering port 1 of the circulator is exiting at port 2 and any reflected power at the reflective probe (67) or at the test port (603) returns and is absorbed at port 3, thus not going back into port 1 and risk damaging the output port of the power amplifier. This embodiment, compared with alternatives using directional couplers to inject back the feedback signal, instead of the circulator, bears the advantage that the feedback power (64) injected through the circulator (65) is higher than using a directional coupler, because an appropriate coupler would have at least 6 dB coupling (or injecting back only 25% of available power of the power amplifier) whereas the circulators yield more than 95% of the returned power. The only shortcoming of this embodiment is that circulators have limited bandwidth, typically one octave, whereas 6 dB couplers can cover more than one frequency decade. If power is less important than bandwidth (testing low power devices) couplers is the best solution. Otherwise one should use circulators as in this embodiment.

The signal entering the test port (603) loses a small portion (602) into the wave-probe and the remaining portion (61) travels towards and is reflected (63) by the mechanical probe (67). FIG. 8 summarizes the major power wave interactions. Power wave <b> comes out of the DUT. Part of it, <b*C1>, is coupled, through the coupling factor C1 into the amplifier. The coupling factor C1 is <<1. The amplifier delivers <b*C1*G>, whereby G is the amplifier gain. This power wave (signal) is coupled back into the main line, through the circulator reduced by the insertion loss of the circulator (S21.C≈0.95). It then travels through the tuner (67) and is reduced by the transmission factor of the tuner (S21.T, varying between 0.1, at high $\Gamma_{tuner}$ and 0.99 at $\Gamma_{tuner}$≈0 (50Ω), i.e. when the tuning probe is withdrawn. The signal power remaining on the main line <b*(1−C1)> after losing a small portion into the wave-probe is reflected at the passive tuner and comes back <b*(1−C1)*$\Gamma_{tuner}$>. The total power wave travelling towards the DUT is then <b*C1*G*S21.C*S21.T>+<b*(1−C1)*$\Gamma_{tuner}$>. In general when $\Gamma_{tuner}$ is large, S21.T is small and vice versa; this creates a natural balance of the system. The total reflection at the DUT port is $\Gamma_{load}$=<a>/<b>=G*C1*S21.C*S21.T+ (1−C1)*$\Gamma_{tuner}$. Depending on C1, S21.C, S21.T and G this value, for a given $\Gamma_{tuner}$, can be equal or higher than 1. This calculation assumes the phase Φ of the active loop is adjusted for the returning power waves to be in phase with the reflected signal at the tuner. An advantage of this solution is that this phase can be adjusted continuously and independently of the tuner reflection phase in order for the combined wave vectors to match the optimum device conjugate impedance at the DUT reference plane by allowing reaching very high Gamma values, independently on the system, couplers, transmission lines etc. (unavoidable) leaks and losses.

Figure 7:
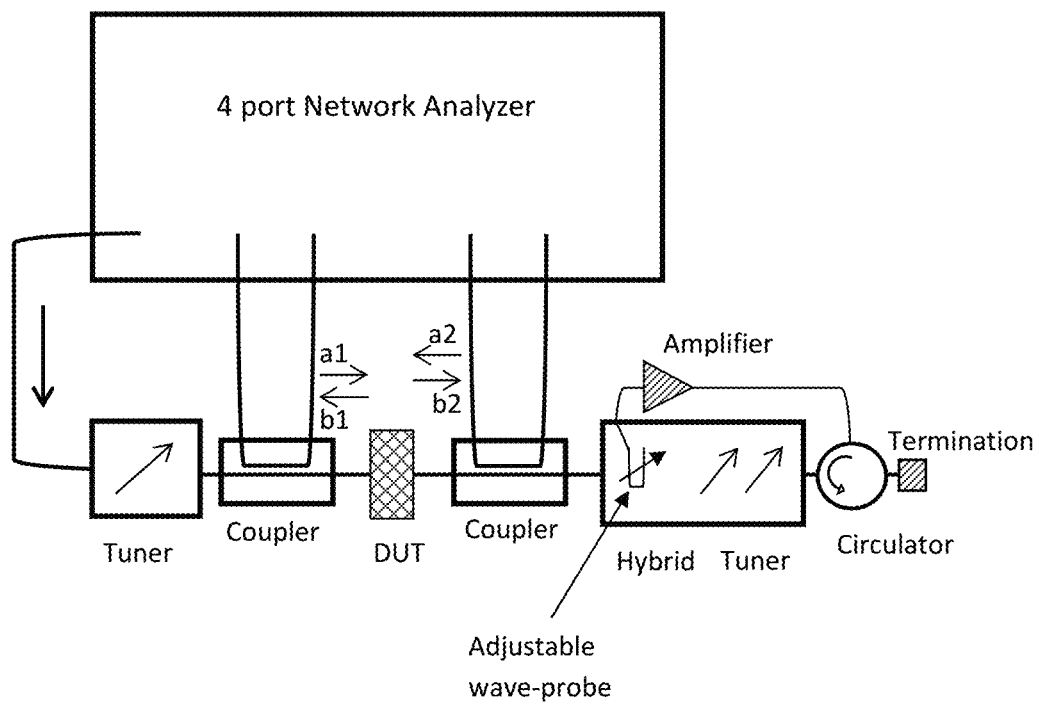
FIG. 7 depicts a complete measurement system using four-port VNA and hybrid tuner.

Active injection networks cannot be pre-calibrated, i.e. their s-parameters cannot be measured and used under varying DUT power test conditions. The reason is that the amplifier will become nonlinear at certain power level, causing a Gain change or a phase distortion, in which case the calibration is lost. Such networks shall be used in load pull networks with on-line wave measurement capability as shown in FIG. 7 (see ref. 7). In this case the incident <b> and reflected <a> power waves at the test port (603), are measured between DUT and test port using directional couplers and corrected to the DUT reference plane using setup calibration (see ref. 7).

Figure 9:
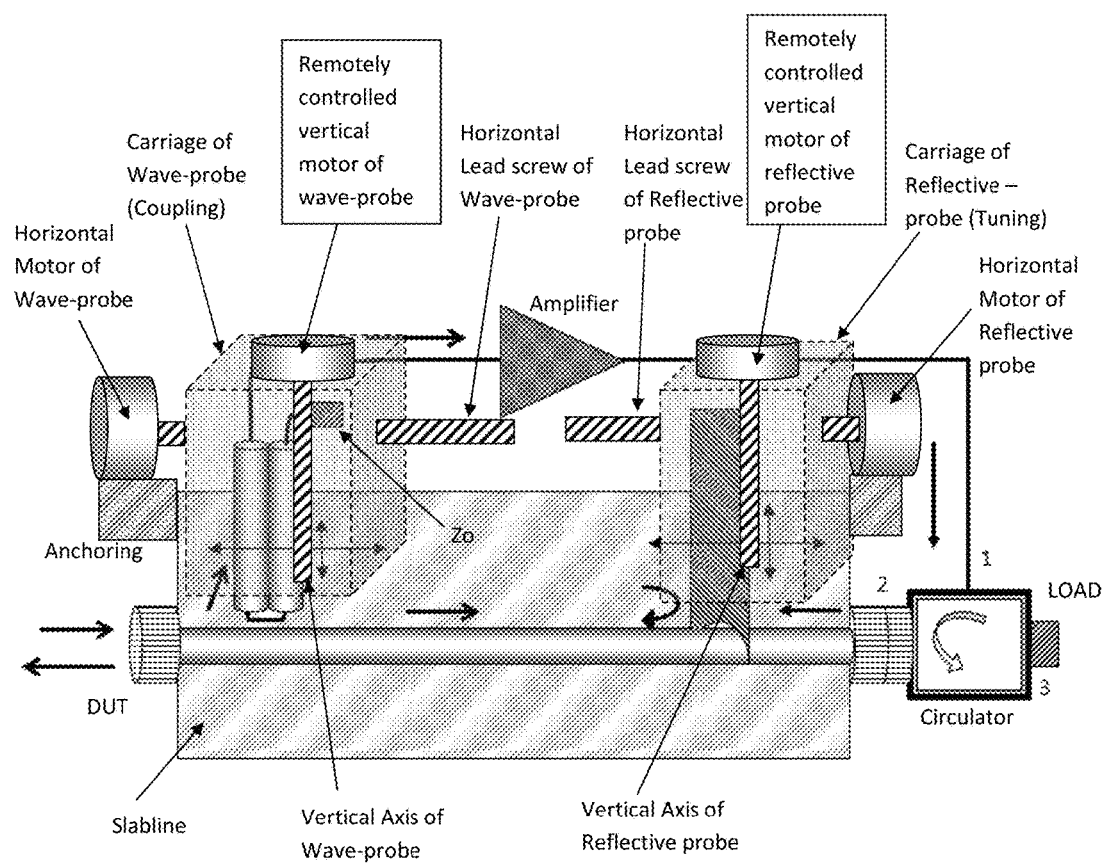
FIG. 9 depicts the concept of automation of the hybrid tuner, showing horizontal and vertical motors and gear controlling the movement of the wave-probe coupler and reflective probe.

FIG. 9 depicts the concept of automating the tuner by attaching the wave-probe on the vertical axis of a first mobile carriage, which controls its penetration and coupling to the center conductor, and, by attaching the reflective probe to the vertical axis of a second carriage, which controls its penetration into the slot of the slabline and thus the amplitude of the passive reflection factor. Both vertical axes are controlled by associated stepper motors. The mobile carriages are independently controlled also horizontally using stepper motors and lead screws or similar gear, the first one controlling the phase of the active loop and the second one the phase of the passive reflection factor. The first carriage is inserted between the test port and the second carriage.

Obvious alternative embodiments are imaginable but shall not impede on the originality of the idea of using slabline based phase and amplitude adjustable signal coupling structure to create an active load pull slide screw tuner and independent Gamma Boosting Unit and output Circulator.

What I claim as my invention is:
1. A hybrid (active/passive) impedance tuner comprising
    (a) a passive, electro-mechanical tuner and
    (b) an active feedback injection loop,
whereby
(a) the passive tuner comprises
    a low loss parallel plate airline (slabline) having an input (test) port and an output (idle) port and a center conductor joining the ports,
    and at least one mobile carriage #1 sliding along the axis of the slabline and having a vertically movable axis,
    whereby a reflective probe is mounted on the vertical axis, said probe being insertable into the slot of the slabline and capacitively coupled with the center conductor;
and
(b) the active feedback injection loop comprises
    (b1) a bidirectional coupler (wave-probe) mounted on the vertical axis of a mobile carriage #2 sliding along the axis of the slabline, whereby the vertical axis controls the penetration of the wave-probe into the slot of the slabline,
    wherein carriage #2 is placed between the test port and carriage #1;
    (b2) a power amplifier having an input and an output port;
    (b3) a circulator having three ports, 1, 2 and 3, signal flow being from port 1 to port 2, from port 2 to port 3 and from port 3 to port 1, whereby port 3 is terminated with characteristic impedance;
    wherein
    the coupled port of the wave-probe is connected to the input port of the amplifier, the output port of the amplifier is connected to port 1 of the circulator and port 2 of the circulator is connected to the idle port of the slabline.

2. The tuner of claim 1, whereby the mobile carriages and their vertical axes are attached to stepper motors using appropriate gear and remotely controlled using controller and software.

3. The tuner of claim 1, whereby the horizontal movement of carriage #2 and vertical movement of the axis of carriage #2 are manually controlled using micrometric screws and gear, and the horizontal movement and vertical axis movement of carriage #1 are automated using stepper motors, appropriate gear, controller and software.

* * * * *